United States Patent [19]

Heminger et al.

[11] Patent Number: 5,751,025

[45] Date of Patent: May 12, 1998

[54] HIGH VOLTAGE CURRENT LIMITER AND METHOD FOR MAKING

[75] Inventors: David M. Heminger, Mesa; Joseph H. Slaughter, Chandler, both of Ariz.

[73] Assignee: Motorola, Inc., Schaumburg, Ill.

[21] Appl. No.: 778,432

[22] Filed: Jan. 2, 1997

Related U.S. Application Data

[62] Division of Ser. No. 560,774, Nov. 21, 1995, Pat. No. 5,629,536.

[51] Int. Cl.[6] .................................................. H01L 29/41
[52] U.S. Cl. ........................ 257/173; 257/402; 257/403; 257/360
[58] Field of Search ........................... 257/335, 360, 257/173, 174, 402, 403, 378, 273, 139, 140, 134, 142, 148

[56] References Cited

U.S. PATENT DOCUMENTS

| | | |
|---|---|---|
| 5,045,902 | 9/1991 | Bancal ........................ 257/403 |
| 5,055,895 | 10/1991 | Akiyama et al. ............... 257/403 |
| 5,191,279 | 3/1993 | Zommer ....................... 323/354 |
| 5,293,051 | 3/1994 | Mariyama et al. ............. 257/129 |
| 5,422,509 | 6/1995 | Zambrano ..................... 257/378 |

Primary Examiner—Tom Thomas
Assistant Examiner—David Hardy
Attorney, Agent, or Firm—Daniel R. Collopy; Vincent B. Ingrassia

[57] ABSTRACT

A current limiter (15) is formed between a silicon substrate (10) and a source region (17) by a channel implant region (20). The channel implant region (20) is not modulated by a gate structure so the maximum voltage that can flow between the silicon substrate (10) and the source region (17) is determined by the doping profile of the ever-present channel implant region (20). A pinch-off structure (12) is used to form a depletion region which can support a large voltage potential between the silicon substrate (10) and the source region (17). In an alternate embodiment, a bipolar device is formed such that a limited current flow can be directed into a base region (32) which is used to modulate a current flow between silicon substrate (30) and an emitter region (38). Using the current limiters (15,35) it is possible to form an AC current limiter (50) that will limit the current flow regardless of the polarity of the voltage placed across two terminals (51,52).

22 Claims, 3 Drawing Sheets

HIGH VOLTAGE CURRENT LIMITER AND METHOD FOR MAKING

This is a division of application Ser. No. 08/560,774, filed Nov. 21, 1995, now U.S. Pat. No. 5,629,536.

BACKGROUND OF THE INVENTION

This invention relates, in general, to semiconductor devices, and more particularly, to current limiting semiconductor devices.

In some semiconductor applications, such as high power motor controllers, it is necessary to integrate high voltage devices with low voltage control logic. The low voltage control logic regulates the amount of power provided to the motor by the high voltage devices. One element commonly used to provide the interface between the high voltage circuit and the low voltage circuit, is a current limiter. Once the voltage of the high voltage circuit exceeds a saturation value, the current limiter generates a constant current to be used by the low voltage circuit.

Traditional current limiters have been formed using junction field effect transistors (JFETs). JFETs form depletion regions to control the current passing through an epitaxial layer. Typically, doped regions are formed at the top and bottom side of an epitaxial layer which are doped to the opposite conductivity as the epitaxial layer. A voltage potential is then used to form a depletion region which restricts the amount of current passing through the epitaxial layer. The performance of the JFET current limiter is determined by a variety of process parameters which are difficult to control. The resistivity of the epitaxial layer, the depth and doping concentration of the doped regions, and the distance between the doped regions can all dramatically affect the performance of the current limiter. In a high volume manufacturing operation, the inability to accurately control these parameters reduces the yield of the final product which in turn increases the manufacturing cost.

Due to the breakdown of a gate oxide or the junctions of a JFET, it is not possible to use JFETs in applications with voltages of 100 volts to 2500 volts. To provide the current limiting function in a high voltage application, circuits containing several elements have been used. In most cases, a sequence of transistors and resistors are used to reduce the voltage potential and provide the constant current value. Such circuits, however, require several additional device elements which increases the manufacturing cost.

By now it should be appreciated that it would be advantageous to provide a single semiconductor device that can be used as a current limiter and that does not require the amount of process control associated with JFETs. It would be of further advantage if the semiconductor device could be used in circuit applications of 100 volts to 2500 volts and did not require the use of a plurality of device elements to provide the current limiting function.

DETAILED DESCRIPTION OF THE DRAWINGS

Figure 1:
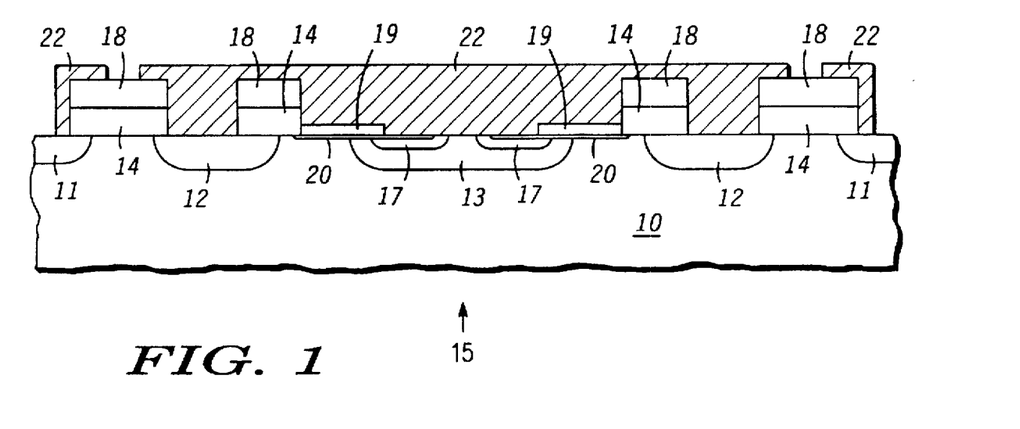
FIGS. 1–4 are enlarged cross-sectional views showing a current limiter according to the present invention at various stages of fabrication.

FIG. 1 is an enlarged cross-sectional view of a semiconductor device which is a high voltage current limiter 15 according to the present invention. Current limiter 15 will provide a relatively constant current flow between a silicon substrate 10, which has a backside that acts as a drain terminal, and a source region 17 when a saturation voltage potential is placed between the drain terminal and source region 17. The current limiting feature is provided by a channel implant region 20 which will carry only a maximum current from the drain terminal, across a channel region 13, and into source region 17. The presence of channel implant region 20 is not controlled by a gate voltage, and it is therefore ever-present. Since the flow of current is not modulated by a gate dielectric layer, current limiter 15 can be used in applications with an input voltage range of 100 volts to 2500 volts.

To support up to 2500 volts between the silicon substrate 10 and source region 17, a pinch-off structure 12 is formed such that the edge of pinch-off structure 12 is 1 μm to 50 μm from the edge of channel region 13. The conductivity of pinch-off structure 12 is the same as channel region 13 so when a voltage potential in excess of 100 volts is placed on silicon substrate 10, a depletion region (not shown) is formed between pinch-off structure 12 and channel region 13 to isolate the drain terminal from source region 17. As a result of the depletion region, the path of the current flow is from the drain terminal, across the depletion region, through channel implant region 20, and into source region 17. The depletion region not only supports up to 2500 volts, but as the voltage on silicon substrate 10 increases, the depletion region will widen and increase the probability that some of the current flow will recombine. This helps minimize the change in current flow as the voltage is increased, and results in a current limiter 15 with a stable current flow for voltages above the saturation voltage.

Portions of current limiter 15 are electrically connected together by a metallized layer 22. A dielectric layer 19 is used to ensure that metallized layer 22 does not contact the drain terminal or the portion of channel implant region 20 which is across channel region 13. As shown in FIG. 1, metallized layer 22 ensures that pinch-off structure 12, source region 17, and channel region 13 are at the same voltage potential. This also ensures that the presence of channel implant region 20 cannot be controlled by a voltage potential across dielectric layer 19 and prevents dielectric layer 19 from having to support a voltage potential. Since the surface of silicon substrate is not inverted, like in a traditional metal oxide field effect transistor (MOSFET), the only path for current across channel region 13 is through channel implant region 20 which provides the current limiting feature for current limiter 15.

Under high voltage operation, it is common for parasitic channels to form near the surface of a device due to the presence of defects which conduct leakage currents. For high voltage applications, current limiter 15 includes edge termination structures 11 which are used to terminate any current which may be flowing near the surface of the drain terminal. It should also be understood that the present invention is also applicable to current limiting applications below 100 volts. Below 100 volts it is possible that the depletion region will not completely isolate the area between pinch-off structure 12 and channel region 13. As a result, current will flow from the drain terminal, across channel implant region 20, and into source region 17. But again, since channel implant region 20 is not modulated, it will only conduct a limited amount of current.

Figure 2:
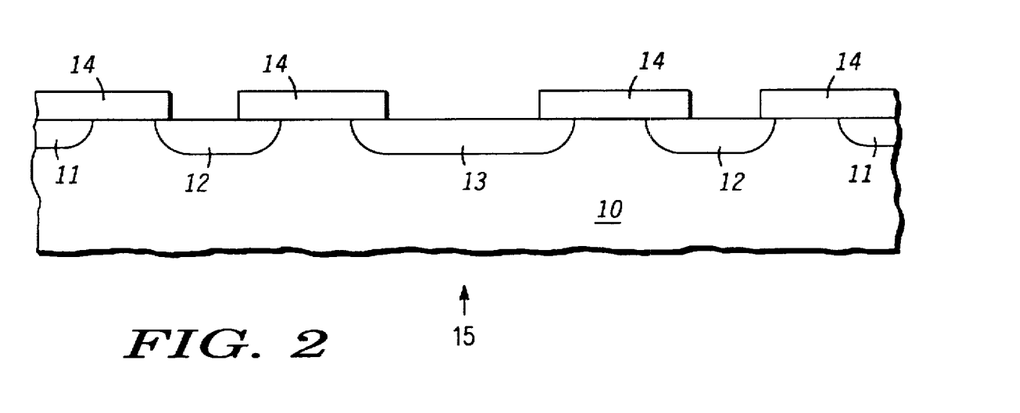
Figure 3:
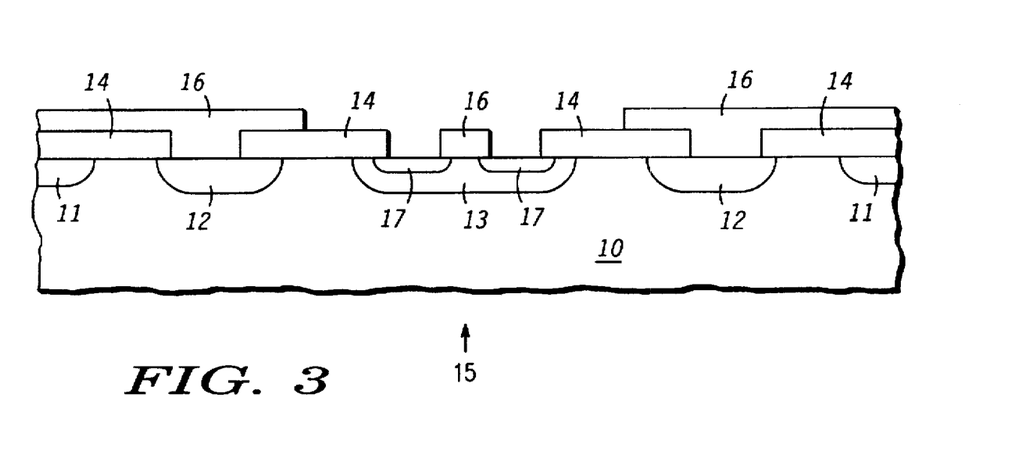
Figure 4:
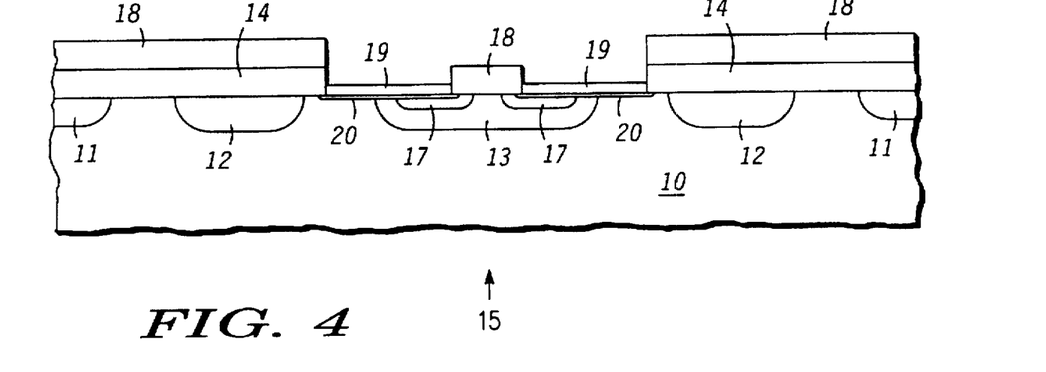

A method for forming current limiter 15, shown in FIG. 1, will now be provided such that silicon substrate 10 and source region 17 are of n-type conductivity. It should be understood that current limiter 15 can also be formed such that silicon substrate 10 and source region 17 are of p-type conductivity by changing all n-type doped regions to p-type and vice versa. FIGS. 2–4 are enlarged cross-sectional views of current limiter 15 at various stages of fabrication, and FIG. 1 shows the completed current limiter 15.

FIG. 2 is an enlarged cross-sectional view of current limiter 15 early in the fabrication process. Current limiter 15 is preferably formed in a silicon substrate 10 which acts as the drain terminal. Silicon substrate 10 can also be a body of semiconductor material 10 made from epitaxial or float zone material. Silicon substrate 10 is doped to have a resistivity of 5 ohm-cm to 50,000 ohm-cm which improves the high voltage characteristics of current limiter 15. A first masking layer 14, preferably of silicon dioxide, is formed on the surface of silicon substrate 10 using a chemical vapor deposition (CVD) process based on the decomposition of tetraethylorthosilicate (TEOS) at 650° C. to 950° C. or the thermal oxidation of silicon substrate 10 in an oxygen rich ambient at 800° C. to 1200° C., or first masking layer 14 is deposited using a plasma enhanced chemical vapor deposition (PECVD) system at 200° C. to 400° C. First masking layer 14 has a thickness of about 4,000 Å to 20,000 Å with a preferred thickness of 8,000 Å.

A first photoresist layer of approximately 1 µm in thickness is then deposited and patterned to expose portions of first masking layer 14. The exposed portions of first masking layer 14 are then removed with either a wet etch buffered solution of hydrofluoric acid or a reactive ion etch (RIE) using a fluorine based ion. The first photoresist layer is then removed using a wet etch of sulfuric acid and peroxide. Silicon substrate 10 is then doped through the openings in first masking layer 14 to simultaneously form doped regions 12 and 13 which become pinch-off structures 12 and channel region 13 respectively.

Doped regions 12 and 13 can be formed with either a boron implant or by diffusing a p-type species such as boron trifluoride into silicon substrate 10. Doped regions 12 and 13 are then annealed to activate the dopant and to move the edges of doped regions 12 and 13 away from the edges of first masking layer 14. An anneal of 900° C. to 1250° C. for 1 hour to 8 hours should be sufficient to activate the dopant. In the preferred embodiment, this drive in anneal takes place in a non-oxidizing ambient such as argon. The shape of the depletion region formed during operation of current limiter 15, can be adjusted by varying the doping concentration and profile of doped regions 12 and 13 and the distance between the edge of pinch-off structure 12 and channel region 13. This distance is typically 1 µm to 50 µm. The maximum voltage that current limiter 15 can support between the drain terminal and source region 17 is partially determined by the depth of pinch-off structure 12 and channel region 13. Pinch-off structure 12 and channel region 13 are typically 3 µm to 30 µm below the surface of silicon substrate 10.

FIG. 3 is an enlarged cross-sectional view of current limiter 15 after further processing. A second masking layer 16, preferably made of photoresist, is formed over first masking layer 14 and the exposed portions of silicon substrate 10. Second masking layer 16 is patterned such that only portions of channel region 13 are exposed. The exposed portions of channel region 13 are then doped n-type to form source regions 17. A phosphorus implant with a dose of $5 \times 10^{13}$ atoms/cm$^2$ to $5 \times 10^{15}$ atoms/cm$^2$ at an energy of 50 keV to 100 keV is used to form the n-type regions. Second masking layer 16 is then removed so current limiter 15 can continue processing.

FIG. 4 is an enlarged cross-sectional view of current limiter 15 after even more processing. A third masking layer 18, preferably comprising silicon dioxide, is deposited with either a CVD or a PECVD deposition or grown from silicon substrate 10 with a thermal oxidation to a thickness of about 1,000 Å to 10,000 Å. An anneal at 900° C. to 1000° C. for 1 hour to 2 hours is performed to activate and drive the dopant used to form source regions 17. A third photoresist layer is then deposited and patterned to expose portions of third masking layer 18. An RIE etch using a chlorine or fluorine based ion is then used to selectively remove portions of third masking layer 18 and underlying first masking layer 14 to expose portions of silicon substrate 10, channel region 13, and source regions 17. The third photoresist layer is removed and a dielectric layer 19 is formed in the open portions of third masking layer 18. Dielectric layer 19 is preferably formed from silicon dioxide which is grown using a wet or dry oxidation in an oxygen rich ambient at 800° C. to 1200° C. to a thickness of about 100 Å to 5,000 Å. Channel implant region 20 is then formed by implanting through dielectric layer 19 with an n-type such as phosphorus. A dose of $5 \times 10^{11}$ atoms/cm$_2$ to $5 \times 10^{12}$ atoms/cm$^2$ with an energy of 50 keV to 100 keV is used to form channel implant region 20. It should also be understood that the n-type regions of the present invention can also be formed using arsenic as the dopant species.

Referring back to FIG. 1 to complete processing of current limiter 15, a fourth photoresist layer (not shown) is then deposited and patterned to expose portions of third masking layer 18. An RIE etch using either a chlorine or a fluorine based ion is used to remove the exposed portions of third masking layer 18 and the underlying portions of first masking layer 14 to expose portions of pinch-off structure 12, source region 17, and channel region 13. It should also be understood that a comparable wet etch can be used to replace many of the RIE etch process of the present invention. The fourth photoresist layer is then removed and a metallized layer 22 is either CVD deposited, sputtered, or evaporated over third masking layer 18, dielectric layer 19, and the exposed portions of pinch-off structure 12, source region 17, and channel region 13. Metallized layer 22 can be formed from either gold, aluminum, aluminum alloy, copper, tungsten, titanium, and titanium tungsten or the like.

A fifth photoresist layer is then deposited and patterned to expose portions of metallized layer 22. An RIE etch is then performed such that the portion of metallized layer 22 which is contacting edge termination structure 11 is electrically isolated from the portion of metallized layer 22 which is contacting pinch-off structure 12. Metallized layer 22 is patterned such that a portion of metallized layer 22 is simultaneously in contact with pinch-off structure 12, channel implant region 20, source region 17, and channel region 13. This will keep these regions in electrical contact with each other so that there is no significant voltage difference across dielectric layer 19. The fifth photoresist layer is then removed to allow further processing of current limiter 15.

The formation of edge termination structures 11 is optional depending on the voltage conditions current limiter 15 will operate under. If edge termination structures 11 are desired, they can be formed at any time prior to the deposition of metallized layer 22 using an additional implant mask such as photoresist and an implant using an n-type species such as phosphorus. To complete processing of current limiter 15, a passivation layer (not shown) of silicon nitride, amorphous silicon, borophosphosilicate glass (BPSG), or phosphosilicate glass (PSG) can be formed over all surfaces of current limiter 15 using a PECVD deposition process.

It should be noted that in the process flow described above, there is no need for the deposition of a polysilicon layer which in the past had been used in semiconductor processing to form gate structures. In the present invention, the amount of current that can pass through current limiter 15 is determined by the doping profile of channel implant region 20 and not on a channel which is modulated by a gate structure. The above mentioned process also has less process variability over a current limiter using a junction field effect transistor (JFET). The process for forming JFET current limiters requires accurate control of a variety of process steps and any slight variation in just one of those steps can hinder the yield of the device. The present invention, therefore, provides a simplified process for forming a current limiter 15 that is both easier to fabricate and as fewer steps which will reduce the final manufacturing cost of current limiter 15.

Figure 5:
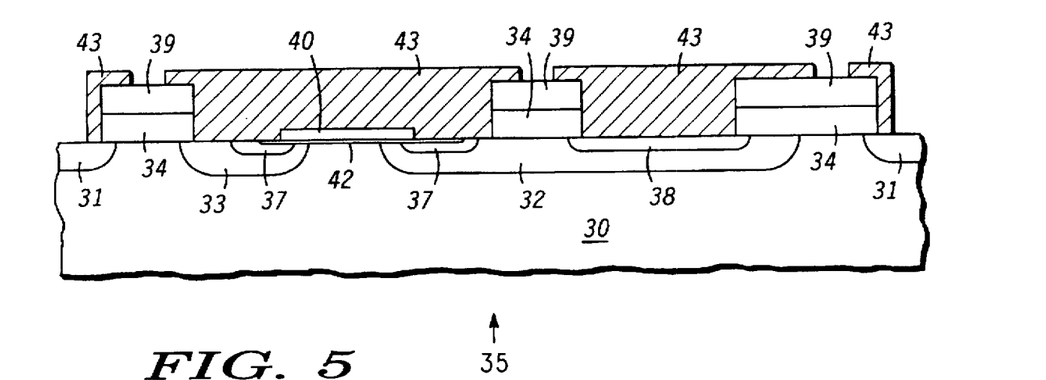
FIGS. 5–8 are enlarged cross-sectional views showing a current limiter according to an alternate embodiment of the present invention at various stages of fabrication.

An alternate embodiment, as shown in FIG. 5, for a current limiter 35 will now be provided. Using the same number of process steps as described above, it is possible to form a bipolar device in conjunction with the current limiting feature to form current limiter 35. Conceptually, a voltage potential between a silicon substrate 30, which acts as a collector terminal, and source region 37 will produce a controlled current flow through channel implant region 42. This current is then passed into a base region 32 which modulates a current flow between an emitter region 38 and the collector terminal. Since the current entering base region 32 is a fixed and predictable quantity, we can design current limiter 35 such that this current is amplified by the gain of the bipolar device of base region 32, silicon substrate 30, and emitter region 38. In the description to follow, base region 32 and channel region 33 are formed as physically separate regions. It should also be understood that base region 32 and channel region 33 can be formed from a physically continuous doped region in a circular layout structure. The edge of source region 37 is preferably 0.1 µm to 10 µm from the edge of channel region 33. Channel region 33 and base region 32 are preferably separated by a distance of 1 µm to 40 µm at the surface of silicon substrate 30 and source region 37 and emitter region 38 are preferably separated by a distance of 0.5 µm to 50 µm.

A metallized layer 43 is formed and patterned such that base region 32, source region 37 and channel implant region 42 are all electrically connected to together. This ensures that there is no significant voltage potential across a dielectric layer 40 which could modulate channel implant region 42. A channel region 33 is formed which, in conjunction with base region 32, forms a depletion region when a large voltage potential is placed on silicon substrate 30. This depletion region is necessary for current limiter 35 to be able to support a voltage potential of 100 volts to 2500 volts between emitter region 38 and silicon substrate 30. When operated, a limited amount of current will flow from the collector terminal, across the depletion region (not shown), and through channel implant region 42 across either channel region 33 or base region 32, and into source regions 37. The sum of this current flows into base region 32 which in turns modulates a current flow between emitter region 38 and the collector terminal.

Figure 6:
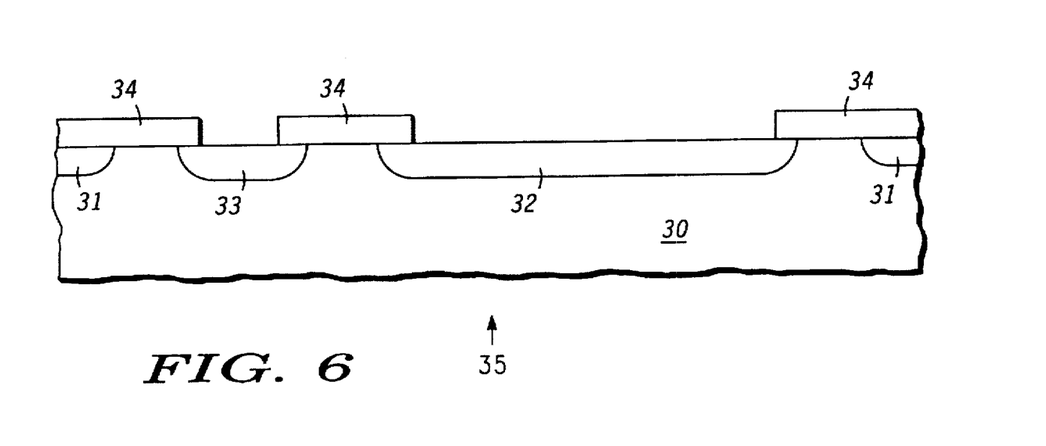
Figure 7:
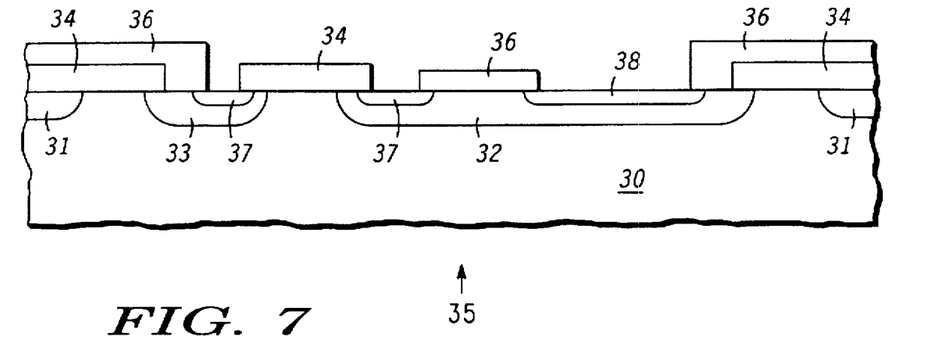
Figure 8:
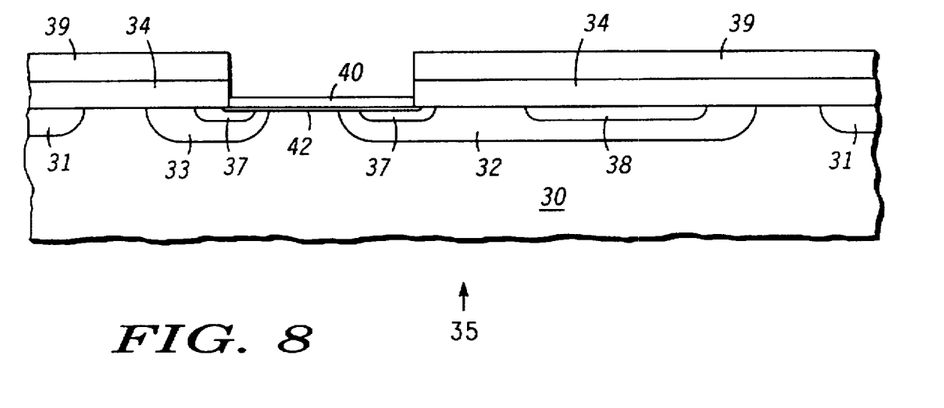

A method for forming current limiter 35, shown in FIG. 5, will now be provided such that silicon substrate 30 and emitter region 38 are of n-type conductivity. It should be understood that current limiter 35 can also be formed such that silicon substrate 30 and emitter region 38 are of p-type conductivity by changing all n-type doped regions to p-type and vice versa. FIGS. 6–8 are enlarged cross-sectional views of current limiter 35 at various stages of fabrication and FIG. 5 shows the completed current limiter 35.

FIG. 6 is an enlarged cross-sectional view of current limiter 35 early in the fabrication process. Current limiter 35 is preferably formed in a silicon substrate 30 which acts as the collector terminal. Silicon substrate 30 can also be a body of semiconductor material 30 made from epitaxial or float zone material. Silicon substrate 30 is doped to have a resistivity of 5 ohm-cm to 50,000 ohm-cm which improves the high voltage characteristics of current limiter 35. A first masking layer 34, preferably of silicon dioxide is either grown using either a chemical vapor deposition (CVD) process using the decomposition of tetraethylorthosilicate (TEOS) at 650° C. to 950° C., the thermal oxidation of silicon substrate 30 in an oxygen rich ambient at 800° C. to 1200° C., or is deposited using a plasma enhanced chemical vapor deposition (PECVD) system at 200° C. to 400° C. First masking layer 34 has a thickness of 4,000 Å to 20,000 Å with a preferred thickness of 8,000 Å.

A first photoresist layer of approximately 1 µm in thickness is then deposited and patterned to expose portions of first masking layer 34. A reactive ion etch (RIE) using a fluorine based ion is then used to remove the exposed portions of first masking layer 34. The first photoresist layer is then removed using a wet etch of sulfuric acid and peroxide. Silicon substrate 30 is then doped through the openings in first masking layer 34 to simultaneously form doped regions 33 and 32 which will become channel region 33 and base region 32 respectively. Doped regions 33 and 32 can be formed with either a boron implant or by diffusing a p-type species such as boron trifluoride into silicon substrate 30. Doped regions 33 and 32 are then annealed to activate the dopant and to move the edges of doped regions 33 and 32 away from the edges of first masking layer 34. An anneal of 900° C. to 1250° C. for 1 hour to 8 hours should be sufficient. The shape of the depletion region formed during operation of current limiter 35, can be adjusted by varying the doping concentration and profile of channel region 33 and base region 32 and the distance between the edge of channel region 33 and base region 32. This distance is typically 1 µm to 50 µm. The maximum voltage that current limiter 35 can support between the collector terminal and emitter region 38 is partially determined by the depth of doped regions 33 and 32. Doped regions 33 and 32 are typically 3 µm to 30 µm below the surface of silicon substrate 30.

FIG. 7 is an enlarged cross-sectional view of current limiter 35 after further processing. A second masking layer 36, preferably made of photoresist, is formed over first masking layer 34 and the exposed portions of silicon substrate 30. Second masking layer 36 is patterned such that only portions of channel region 33 and base region 32 are exposed. The exposed portions of channel region 33 and base region 32 are then doped n-type to form source regions 37 and emitter region 38 simultaneously. A phosphorus implant with a dose of $5\times10^{14}$ atoms/cm$^2$ to $5\times10^{15}$ atoms/cm$^2$ is used to form the n-type regions. Second masking layer 36 is then removed so current limiter 35 can continue processing.

FIG. 8 is an enlarged cross-sectional view of current limiter 35 after ever further processing. A third masking layer 39, preferably comprising silicon dioxide, is deposited with either a CVD or a PECVD deposition with a thickness of 1,000 Å to 10,000 Å. An anneal at 900° C. to 1000° C.

for 1 hour to 2 hours is performed to activate and drive the dopant used to form source regions 37 and emitter region 38. A third photoresist layer is then deposited and patterned to expose portions of third masking layer 39. A RIE etch using a chlorine or fluorine based ion is then used to selectively remove portions of third masking layer 39 and underlying first masking layer 34 to expose portions of silicon substrate 30, channel region 33, source regions 37, and base region 32. The third photoresist layer is removed and a dielectric layer 40 is formed in the open portions of third masking layer 39. Dielectric layer 40 is preferably formed from silicon dioxide which is grown using a wet oxidation in an oxygen rich ambient at 800° C. to 1200° C. to form a thickness of 100 Å to 5,000 Å. Channel implant region 42 is then formed by implanting through dielectric layer 40 with an n-type such as phosphorus. A dose of $5 \times 10^{11}$ atoms/cm$^2$ to $5 \times 10^{12}$ atoms/cm$^2$ with an energy of 50 keV to 150 keV is used to form channel implant region 42.

Referring back to FIG. 5 to complete processing of current limiter 35, a fourth photoresist layer is then deposited and patterned to expose portions of third masking layer 39. An RIE etch using either a chlorine or a fluorine based ion is used to remove the exposed portions of third masking layer 39 and the underlying portions of first masking layer 34 to expose portions of channel region 33, source region 37, base region 32, and emitter region 38. The fourth photoresist layer is then removed and a metallized layer 43 is either CVD deposited, sputtered, or evaporated over third masking layer 39, dielectric layer 40, and the exposed portions of channel region 33, source region 37, base region 32, and emitter region 38. Metallized layer 43 can be formed from either gold, aluminum, aluminum alloy, copper, tungsten, titanium, and titanium tungsten or the like.

A fifth photoresist layer is then deposited and patterned to expose portions of metallized layer 43. An RIE etch is then performed such that the portion of metallized layer 43 which is contacting edge termination structure 31, base region 32, and emitter region 38 are electrically isolated from each other as shown in FIG. 5. Metallized layer 43 is patterned such that a portion of metallized layer 43 is simultaneously in contact with channel region 33, channel implant region 42, source region 37, and base region 32. This will keep these regions in electrical contact with each other so that there is no significant voltage difference across dielectric layer 40. The fifth photoresist layer is then removed to allow further processing of current limiter 35.

The formation of edge termination structures 31 is optional depending on the voltage conditions current limiter 35 will operate under. If edge termination structures 31 are desired, they can be formed at any time prior to the deposition of metallized layer 43 using an additional implant mask such as photoresist and an implant using an n-type species such as phosphorus. To complete processing of current limiter 35, a passivation layer (not shown) of silicon nitride, borophosphosilicate glass (BPSG), or phosphosilicate glass (PSG) can be formed over all surfaces of current limiter 35 using a PECVD deposition process.

It should be noted that in the process flow described above, there is no need for the deposition of a polysilicon layer which in the past had been used in semiconductor processing to form gate structures. In the present invention, the amount of current that can pass through current limiter 35 is determined by the doping profile of channel implant region 42 and not on a channel which is modulated by a gate structure. The above mentioned process also has less process variability over current limiter using a junction field effect transistor (JFET). The process for forming JFET current limiters requires accurate control of a variety of process steps and any slight variation in just one of those steps can hinder the yield of the device. The present invention, therefore, provides a simplified process for forming a current limiter 35 that is both easier to fabricate and as fewer steps which will reduce the final manufacturing cost of current limiter 35.

Figure 9:
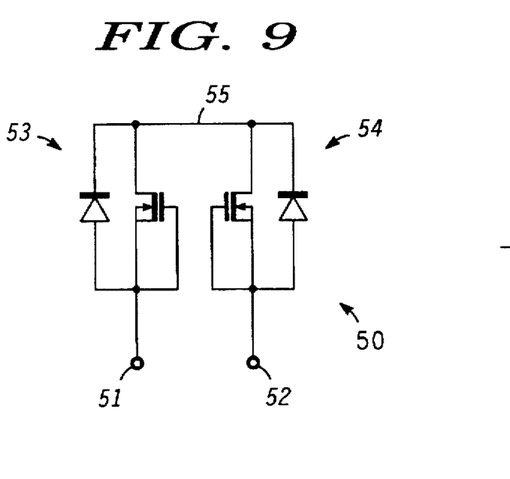
FIG. 9 is a schematic representation of a circuit according to the present invention.

A functional application for current limiters 15 or 35 will now be provided. FIG. 9 is a schematic representation of two current limiters 53 and 54 which are connected together to form an AC current limiter 50. If an AC voltage is placed across terminals 51 and 52, AC current limiter 50 will provide a maximum current flow out of each of the terminals 51 and 52. Current limiters 53 and 54 can be formed using current limiter 15 of the present invention, then two current limiters 15 are fabricated such the corresponding the drain terminal of each current limiter 15 is electrically connected together. This is represented by the electrical connection 55 shown in FIG. 9. Source region 17 of each current limiter 15 would then correspond to the terminals 51 and 52 of current limiters 53 and 54 respectively.

Figure 10:
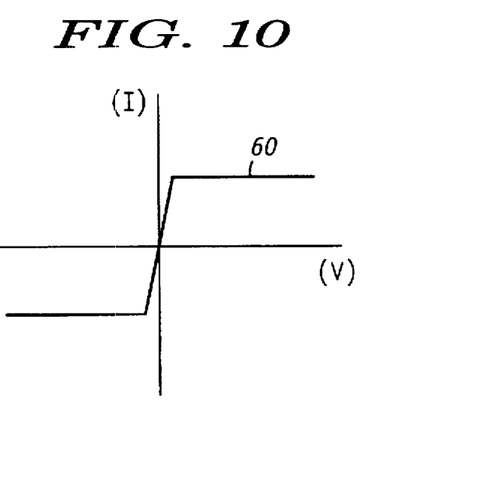
FIG. 10 is a graph showing the characteristics of an AC current limiter.

FIG. 10 is a graph plotting the output current of AC current limiter 50 as the voltage across terminals 51 and 52 is varied. Line 60 represents the current that would flow out of one of the terminals 51 or 52 as a function. As can be seen in FIG. 10, there is a maximum output current of AC current limiter 50 regardless of the polarity of the voltage placed across terminals 51 and 52.

By now it should be appreciated that the present invention provides an improved structure and method for forming a current limiter 15 and 35 which provide a maximum current flow regardless of the voltage potential applied. The present invention does not require the formation of a polysilicon layer since a gate structure is not used to regulate the current flow like in other semiconductor devices. In addition, the present invention is not subject to the rigorous process control which is required with current limiters formed from JFETs. The process simplification and improved tolerances of the present invention provides a current limiter that has both a wider voltage range to operate under and a reduced manufacturing cost.

We claim:

1. A current limiter comprising:
 a body of semiconductor material of a first conductivity having a surface and serving as a collector terminal;
 a first doped region of a second conductivity having an edge and formed in the body of semiconductor material contiguous with the surface;
 a second doped region of the first conductivity having an edge and formed in the first doped region such that the second doped region is contiguous with the surface and the edge of the second doped region is offset from the edge of the first doped region by a first distance;
 a third doped region of the second conductivity having an edge and formed in the body of semiconductor material.

2. The high voltage current limiter of claim 1 wherein the metallized layer is formed from a metal selected from the group consisting of gold, aluminum, aluminum alloy, copper, tungsten, titanium, and titanium tungsten.

3. The high voltage current limiter of claim 1 wherein the first distance is 0.1 μm to 10 μm.

4. The high voltage current limiter of claim 1 wherein the second distance is 1 μm to 40 μm.

5. The high voltage current limiter of claim 1 wherein the third distance is 0.5 μm to 50 μm.

6. A method for forming a semiconductor device comprising the steps of:
   providing a semiconductor substrate having a surface and a backside;
   forming a first masking layer on the surface of the semiconductor device;
   patterning the first masking layer to expose the semiconductor substrate;
   doping exposed portions of the semiconductor substrate to form a channel region and a pinch-off structure;
   forming a second masking layer over portions of the first masking layer such that portions of the semiconductor substrate are exposed;
   doping exposed portions of the semiconductor substrate to form a source region;
   forming a third masking layer on the semiconductor substrate such that a portion of the semiconductor substrate, the channel region, and the source region are exposed;
   forming a dielectric layer on exposed portions of the semiconductor substrate, the channel region, and the source region;
   forming a non-modulated path for a current flow between the semiconductor substrate and the source region; and
   forming a metallized layer overlying the semiconductor substrate such that the source region and the pinch-off structure are electrically connected, and the backside of the semiconductor substrate serving as a control electrode.

7. The method for forming a semiconductor device of claim 6 wherein the step of forming the non-modulated path includes implanting the semiconductor substrate through the dielectric layer.

8. The method for forming a semiconductor device of claim 7 wherein the step of forming the second masking layer over portions of the first masking layer includes exposing a portion of the pinch-off structure and forming an emitter region as the source region is formed.

9. The method for forming a semiconductor device of claim 7 wherein the step of doping exposed portions of the semiconductor substrate to form the channel region and the pinch-off structure includes doping the channel region and the pinch-off structure such that the channel region and the pinch-off structure extend into the semiconductor substrate 1 μm to 30 μm.

10. The method for forming a semiconductor device of claim 7 wherein the step of forming the dielectric layer on exposed portions of the semiconductor substrate includes forming a layer of silicon dioxide that is 100 angstroms to 30,000 angstroms thick.

11. A semiconductor device comprising:
   a semiconductor substrate having a surface;
   a first doped region of a first conductivity in the semiconductor substrate and extending from the surface;
   a second doped region of the first conductivity in the semiconductor substrate and extending from the surface, wherein the second doped region is separated from the first doped region by a first distance;
   a third doped region of a second conductivity within the second doped region;
   a fourth doped region of the second conductivity;
   a fifth doped region of the second conductivity, wherein both the fourth and fifth doped region are within the first doped region; and
   a sixth doped region of the first conductivity in the semiconductor substrate, wherein the sixth doped region overlaps at least a portion of the third doped region and the fourth doped region.

12. The semiconductor device of claim 11 wherein the sixth doped region overlaps at least a portion of the first and second doped region, and the semiconductor device further comprises a dielectric layer overlying the sixth doped region.

13. The semiconductor device of claim 12 wherein the dielectric layer overlies the portions of the first doped region and the second doped region that are overlapped by the sixth doped region.

14. The semiconductor device of claim 11 wherein the sixth doped region limits a flow of current into the first doped region when a voltage potential is placed between the semiconductor substrate and the fifth doped region.

15. The semiconductor device of claim 14 wherein the semiconductor device amplifies the flow of current into the first doped region and produces an output current flow between the semiconductor substrate and the fifth doped region.

16. The semiconductor device of claim 14 wherein the semiconductor device can support a voltage potential of about 100 volts to 2500 volts.

17. The semiconductor device of claim 11 wherein the first distance is about 0.1 μm to 10 μm.

18. A method of forming a current limiter comprising the steps of:
   providing a body of semiconductor material of a first conductivity having a surface;
   forming a first doped region of a second conductivity having an edge and formed in the body of semiconductor material contiguous with the surface;
   forming a second doped region of the first conductivity having an edge and formed in the first doped region such that the second doped region is contiguous with the surface and the edge of the second doped region is offset from the edge of the first doped region by a first distance;
   forming a third doped region of the second conductivity having an edge and formed in the body of semiconductor material such that the edge of the third doped region is separated from the edge of the first doped region by a second distance;
   forming a fourth doped region of the first conductivity having an edge and formed in the third doped region such that the edge of the fourth doped region is offset from the edge of the third doped region by a third distance;
   forming a fifth doped region of the first conductivity formed in the third doped region;
   forming a sixth doped region formed in the body of semiconductor material such that the second doped region and the fourth doped region are electrically coupled together;
   forming a metallized layer contiguous with at least a portion of the surface such that the first doped region, the second doped region, the third doped region and the fourth doped region are electrically coupled together; and
   forming a dielectric layer contiguous with the surface and overlying at least a portion of the sixth doped region such that the metallized layer and the collector terminal are electrically isolated.

19. A method for forming a semiconductor device comprising the steps of:
   providing a semiconductor substrate having a surface and a backside;
   forming a first masking layer on the surface of the semiconductor device;
   forming the first masking layer to expose the semiconductor substrate;
   doping exposed portions of the semiconductor substrate to form a channel region and a pinch-off structure;
   forming a second masking layer over portions of the first masking layer such that portions of the semiconductor substrate are exposed;
   doping exposed portions of the semiconductor substrate to form a source region;
   forming a third masking layer on the semiconductor substrate such that a portion of the semiconductor substrate, the channel region, and the source region are exposed;
   forming a dielectric layer on exposed portions of the semiconductor substrate, the channel region, and the source region;
   providing a non-modulated path for a current flow between the semiconductor substrate and the source region; and
   forming a metallized layer overlying the semiconductor substrate such that the source region and the pinch-off structure are electrically connected, and the backside of the semiconductor substrate serving as a control electrode.

20. The method for forming a semiconductor device of claim 19 wherein the step of forming the first masking layer includes patterning the first masking layer.

21. The method for forming a semiconductor device of claim 20 wherein the step of providing the non-modulated path includes the step of implanting the semiconductor substrate through the dielectric layer.

22. The method for forming a semiconductor device of claim 20 wherein the step of doping exposed portions of the semiconductor substrate to form the channel region and the pinch-off structure includes doping the channel region and the pinch-off structure such that the channel region and the pinch-off structure extend into the semiconductor substrate 1 μm to 30 μm.

* * * * *

UNITED STATES PATENT AND TRADEMARK OFFICE
CERTIFICATE OF CORRECTION

PATENT NO. : 5,751,025
DATED : May 12, 1998
INVENTOR(S) : David M. Heminger et al.

It is certified that error appears in the above-identified patent and that said Letters Patent is hereby corrected as shown below:

Column 8,
Line 56, delete "material." and add -- material such that the edge of the third doped region is separated from the edge of the first doped region by a second distance, the third doped region serving as a base region;

a fourth doped region of the first conductivity having an edge and formed in the third doped region such that the edge of the fourth doped region is offset from the edge of the third doped region by a third distance;

a fifth doped region of the first conductivity formed in the third doped region serving as an emitter region;

a sixth doped region formed in the body of semiconductor material such that the second doped region and the fourth doped region are electrically connected;

a metallized layer continguous with at least a portion of the surface such that the first doped region, the second doped region, the third doped region and the fourth doped region are electrically connected together; and     a dielectric layer continguous with the surface and overlying at least a portion of the sixth doped region such that the metallized layer and the collector terminal are electrically isolated. --.

Signed and Sealed this

Fourteenth Day of May, 2002

*Attest:*

*Attesting Officer*

JAMES E. ROGAN
*Director of the United States Patent and Trademark Office*